United States Patent [19]
Sugiyama et al.

[11] Patent Number: 5,879,763
[45] Date of Patent: Mar. 9, 1999

[54] METHOD OF FORMING HARD CARBON FILM OVER INNER SURFACE OF CYLINDRICAL MEMBER

[75] Inventors: Osamu Sugiyama, Tokorozawa; Yukio Miya, Kawagoe; Takashi Toida, Tokyo, all of Japan

[73] Assignee: Citizen Watch Co., Ltd., Tokyo, Japan

[21] Appl. No.: 922,382

[22] Filed: Sep. 3, 1997

[51] Int. Cl.[6] .............................. B05D 3/06; B05D 7/22; C23C 16/26
[52] U.S. Cl. ..................... 427/577; 427/237; 427/238; 427/239
[58] Field of Search .................... 427/577, 237, 427/238, 239, 249

[56] References Cited

U.S. PATENT DOCUMENTS

| | | | |
|---|---|---|---|
| 4,746,538 | 5/1988 | Mackowski | 427/237 |
| 4,859,489 | 8/1989 | Pinkhasov | 427/238 |
| 5,521,351 | 5/1996 | Mahoney | 427/577 |
| 5,798,139 | 8/1998 | Nagashima et al. | 427/237 |

Primary Examiner—Roy V. King
Attorney, Agent, or Firm—Armstrong, Westerman Hattori, McLeland & Naughton

[57] ABSTRACT

A cylindrical member having a center bore is disposed in a vacuum vessel provided with a gas inlet port and a gas outlet port, and an auxiliary electrode is inserted into the center bore of the cylindrical member along the central axis thereof so as to extend to substantially an entire length of the center bore, thereby permitting the auxiliary electrode to be grounded or having a positive DC voltage applied to the auxiliary electrode. A gas containing carbon is supplied into the vacuum vessel through the gas inlet port after the vacuum vessel is evacuated and a voltage is applied to the cylindrical member to produce a plasma in the vacuum vessel including an inside of the center bore of the cylindrical member, thereby forming a hard carbon film over the inner surface of the cylindrical member by a plasma CVD process.

10 Claims, 10 Drawing Sheets

METHOD OF FORMING HARD CARBON FILM OVER INNER SURFACE OF CYLINDRICAL MEMBER

BACKGROUND OF THE INVENTION

1. Field of the Invention

The present invention relates to a method of forming a film over the inner surface of a cylindrical member having a center bore and, more particularly, to a method of forming a hard carbon film for enhancing the abrasion resistance of the inner surface of a cylindrical member (part), such as a bushing, a piston cylinder and a linear bearing.

2. Description of the Related Art

A hard carbon film is black and has properties similar to those of diamond. That is, the hard carbon film has advantageous properties including a high mechanical hardness, a small friction coefficient when contacting other materials, a high electrical insulation property, a large thermal conductivity and a high corrosion resistance. Accordingly, there have been proposals for coating various devices, including various ornaments, medical instruments, magnetic heads, tools and such with a hard carbon film.

A hard carbon film is a hydrogenated amorphous carbon film having properties very similar to those of diamond and hence a hard carbon film is often called a diamond like carbon film (DLC film) or an i-carbon film.

It is possible to remarkably enhance the abrasion resistance of the inner surface which is in slidable contact with other members by forming the hard carbon film over the inner surface of a cylindrical member having a center bore like various bushes such as a guide bush which is mounted on an automatic lathe to support a rod-shaped work-piece sidably and rotatably, a piston cylinder and a linear bearing.

Accordingly, the following steps are taken for forming the hard carbon film over the inner surface of the cylindrical member set forth above using a conventional chemical vapor deposition process.

That is, as shown in FIG. 14, a cylindrical member 11 having a center bore 11a is placed in a vacuum vessel 13 provided with a gas inlet port 15 and a gas outlet port 17.

The vacuum vessel 13 is evacuated through the gas outlet port 17 by an evacuating means, not shown. Then, a gas which contains carbon is supplied into the vacuum vessel 13 through the gas inlet port 15 and the pressure in the vacuum vessel 13 is adjusted to a set pressure.

Thereafter, a positive DC voltage is applied to an anode 31 placed within the vacuum vessel 13 from an anode power source 27, and an AC voltage is applied to a filament 33 by a filament power supply 29. Further, a negative DC voltage is applied to the cylindrical member 11 by a DC power source 25. Thus, a plasma is produced in the vacuum vessel 13 to deposit a hard carbon film on the entire surface including the inner surface 11b of the cylindrical member 11.

The hard carbon film forming process shown in FIG. 14 uses the plasma produced by the DC voltage applied to the cylindrical member 11 and the plasma produced by the filament 33 energized by the AC voltage and the anode 31 energized by the DC voltage. Either the plasma produced around the cylindrical member 11 or the plasma produced around the filament 33 and the anode 31 contributes mainly to hard carbon film formation depending on the pressure in the vacuum vessel 13 during hard carbon film formation.

For example, when the pressure in the vacuum vessel 13 is $3 \times 10^{-3}$ torr or above, the plasma produced around the cylindrical member 11 mainly contributes to the decomposition of the gas containing carbon to form the hard carbon film.

Although a hard carbon film can be formed uniformly over the outer surface of the cylindrical member 11, a hard carbon film formed over the inner surface 11b defining the center bore 11a is poor in adhesion, and inferior in qualities such as hardness. This is because a set voltage is applied to the whole of the cylindrical member 11, and the center bore 11a defines a space in which electrodes of the same potential are disposed opposite to each other, and thus the plasma prevailing in the center bore 11a causes an abnormal discharge called hollow discharge. A hard carbon film formed by hollow discharge is a polymer like film inferior in adhesion and apt to come off the inner surface 11b of the cylindrical member 11, and it has a relatively low hardness.

On the other hand, when the pressure in the vacuum vessel 13 is below $3 \times 10^{-3}$ torr, the plasma produced in the neighborhood of the filament 33 and the anode 31 rather than the plasma produced around the cylindrical member 11 contributes mainly to hard carbon film formation.

Although a hard carbon film can be uniformly formed over the outer surface of the cylindrical member 11, the hard carbon film cannot be formed in a uniform thickness with respect to a direction along the axis of the cylindrical member 11 over the inner surface lib defining the center bore 11a.

Carbon ions produced by the plasma produced around the filament 33 and the anode 31 are attracted to the surface of the cylindrical member 11 by the negative DC potential of the cylindrical member 11 to deposit the hard carbon film over the surface of the cylindrical member 11.

The hard carbon film is formed by a chemical vapor deposition process when the pressure in the vacuum vessel 13 is above $3 \times 10^{-3}$ torr, and the hard carbon film is formed by a physical vapor deposition process when the pressure in the vacuum vessel 13 is below $3 \times 10^{-3}$ torr. Therefore, the thickness of the hard carbon film formed over the inner surface 11b of the cylindrical member 11 decreases from the open end of the center bore 11a downwards to the depth thereof, which occurs when forming a film by a physical vapor-phase epitaxial growth process, such as a vacuum deposition process, when the plasma produced around the filament 33 and the anode 31 contributes mainly to hard carbon film formation. Consequently, the hard carbon film cannot be formed with a uniform thickness over the entire inner surface 11b of the cylindrical member 11.

A thickness distribution in a hard carbon film formed over the inner surface of a cylindrical member will be explained with reference to FIG. 15. In the graph of FIG. 15, distance from the open end of the cylindrical member is measured on the horizontal axis and thickness of film formed over the inner surface of the cylindrical member is measured on the vertical axes. In the graph of FIG. 15, curve a indicates the variation of the thickness of the hard carbon film formed over the inner surface of the cylindrical member by the method described with reference to FIG. 14.

As is obvious from curve a in FIG. 15, the thickness of a hard carbon film formed by the conventional method (in case of formation of an intermediate layer) decreases sharply from 1.0 $\mu$m at the open end of the bore to 0.2 $\mu$m at a position 30 mm inward from the open end.

Since the hard carbon film has such a sharply changing thickness, even if the hard carbon film is formed over the inner surface of a cylindrical member, it cannot fully exercise its advantageous characteristics including high abrasion resistance and high corrosion resistance.

SUMMARY OF THE INVENTION

It is an object of the present invention to solve the foregoing problems, and to form a hard carbon film having a uniform thickness over the inner surface of a cylindrical member so as to adhere to the inner surface with high adhesion.

To achieve this object, a method of forming the hard carbon film over the inner surface of the cylindrical member according to the present invention comprises as follows.

A cylindrical member having a center bore is disposed in a vacuum vessel provided with a gas inlet port and a gas outlet port, an auxiliary electrode is inserted into the center bore of the cylindrical member along a central axis thereof to extend to substantially an entire length thereof, and the auxiliary electrode is grounded or a positive DC voltage is applied to the auxiliary electrode.

After evacuating the vacuum vessel, a gas containing carbon is supplied into the vacuum vessel through the gas inlet port, and a voltage is applied to the cylindrical member to produce a plasma in the vacuum vessel including an inside of the center bore of the cylindrical member, thereby forming a hard carbon film over the inner surface of the cylindrical member by a plasma CVD (chemical vapor deposition) process.

For producing a plasma in the vacuum vessel including the inside of the center bore of the cylindrical member, there is a method of using a vacuum vessel provided with an anode and a filament therein, and applying a DC voltage to the cylindrical member while applying the DC voltage to the anode and an AC voltage to the filament.

There is also a method of applying radio frequency power to the cylindrical member without using an anode and a filament, or a method of applying a DC voltage alone to the cylindrical member.

It is preferable, in the method of forming the hard carbon film over the inner surface of the cylindrical member, to form an intermediate layer over the inner surface of the cylindrical member for enhancing adhesion to the hard carbon film before disposing the cylindrical member in the vacuum vessel.

According to the present invention, since an auxiliary electrode which is grounded or to which a positive DC voltage is applied is inserted into the center bore of the cylindrical member provided with the electrodes having the same potential and opposing each other along substantially the entire length thereof, electrodes having the same potential do not oppose each other.

Such a state of potential is most preferable for the plasma CVD process, and no hollow discharge is generated. Accordingly, a hard carbon film having excellent adhesion can be formed over the inner surface of the cylindrical member.

Further, the electrode characteristic inside the center bore of the cylindrical member is made uniform along the entire length thereof. Accordingly there does not occur a thickness distribution in the hard carbon film formed over the inner surface of the cylindrical member, thereby forming a film having a uniform thickness extending from the portion adjacent to the open end to the inner side.

Preferably, dummy members having a center bore the diameter of which is substantially the same as that of the cylindrical member are disposed with the cylindrical member to be brought into contact with at least one open end surface of the cylindrical member at one end surface in such a manner that the central axes between the center bores conform to one another, and the dummy members and the cylindrical member are respectively disposed in the vacuum vessel. Next, the auxiliary electrode is inserted into the center bore of the cylindrical member to extend substantially the entire length of both center bores of the cylindrical member and the dummy members along the central axis thereof, and thereafter the auxiliary electrode is grounded or a positive DC voltage is applied to the auxiliary electrode.

As a result, an area which is slightly inferior in adhesion is formed at the area extending to several mm from the open end surface of the center bore on the dummy member owing to the concentration of the electric charge at the end surface area of the cylindrical member, thereby uniformly forming a hard carbon film over the inner surface of the cylindrical member at the entire area thereof including the portion adjacent to the open end with high adhesion.

The cylindrical member is a cylindrical member (including those with one end closed) having an inner surface to be brought into contact with another member, such as a guide bush, a cylinder or a bearing, and it is generally made of metal such as carbon tool steel (SK steel). However, the present invention is applicable to a cylindrical member made of an insulating material, such as a ceramic material, and a cylindrical member formed by coating the inner surface of a metal base with a cemented carbide or a ceramic material by brazing or the like.

Even if the cylindrical member is made of an insulating material, a voltage can be applied to the cylindrical member provided that an intermediate layer made of a conductive material is formed over the surface of the cylindrical member.

The above and other objects, features and advantages of the invention will be apparent from the following detailed description which is to be read in conjunction with the accompanying drawings.

DETAILED DESCRIPTION OF THE PREFERRED EMBODIMENTS

Preferred embodiments of the present invention will be described hereinafter with reference to the accompanying drawings.

Figure 1:
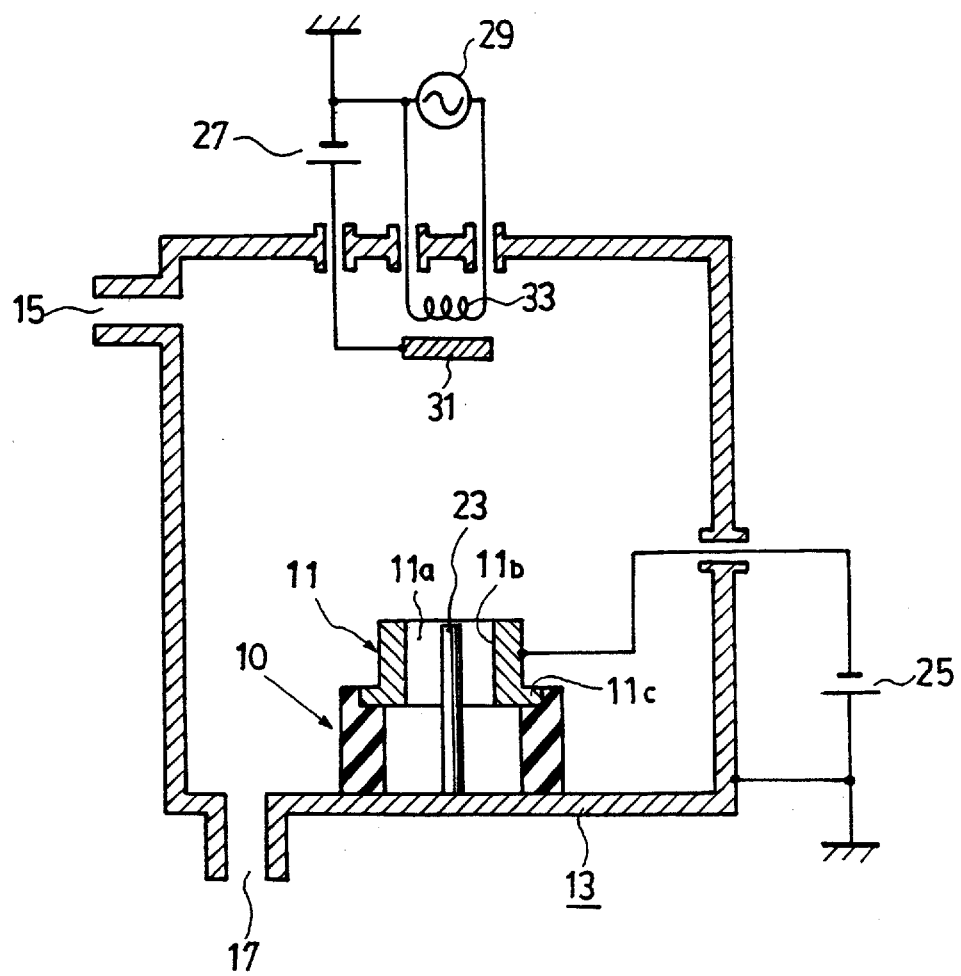
FIGS. 1, 2 and 3 are schematic sectional views for explaining film forming apparatuses for carrying out a hard carbon film forming process according to various embodiments of the present invention.

FIG. 1 is a schematic sectional view for explaining a film forming apparatus for carrying out a carbon film forming process according to an embodiment of the present invention;

As shown in FIG. 1, a cylindrical member 11 having a center bore 11a and a flange 11c at one end of the periphery thereof is supported at the flange 11c by a plurality of insulating work supports 10 in a vacuum vessel 13 provided with a gas inlet port 15 and a gas outlet port 17, then it is fixed onto and placed on the bottom surface of the vacuum vessel 13. A rod-shaped auxiliary electrode 23 is inserted into the center bore 11a of the cylindrical member 11 along the central axis to extend to substantially the entire length of the center bore 11a. The auxiliary electrode 23 is fixed vertically onto the bottom surface of the grounded vacuum vessel 13 and is grounded in potential.

The vacuum vessel 13 is evacuated to a vacuum of $3\times10^{-5}$ torr through the gas outlet port 17. Then, benzene gas ($C_6H_6$ gas) is supplied into the vacuum vessel 13 as a gas containing carbon through the gas inlet port 15 so that the pressure in the vacuum vessel 13 is adjusted to be a vacuum of $5\times10^{-3}$ torr.

A DC power source 25 applies a DC voltage of –3 kV to the cylindrical member 11, and an anode power source 27 applies a DC voltage of +50 V to an anode 31 provided in the upper portion of the vacuum vessel 13, and a filament power source 29 applies 10 V AC voltage to a filament 33 so that an AC current of 30 A flows through the filament 33.

Thus, a plasma is produced around the cylindrical member 11 in the vacuum vessel 13 to form a hard carbon film formed of hydrogenated amorphous carbon over the entire surface of the cylindrical member 11 by a plasma CVD process.

At this time, since the auxiliary electrode 23 of the ground potential is inserted in the center bore 11a of the cylindrical member 11, the plasma is sufficiently produced in the center bore 11a as well as around the cylindrical member 11, and an abnormal discharge, i.e. hollow discharge, is not generated. As a result, a hard carbon film is formed over the inner surface 11b of the cylindrical member 11 with high adhesion.

Figure 4:
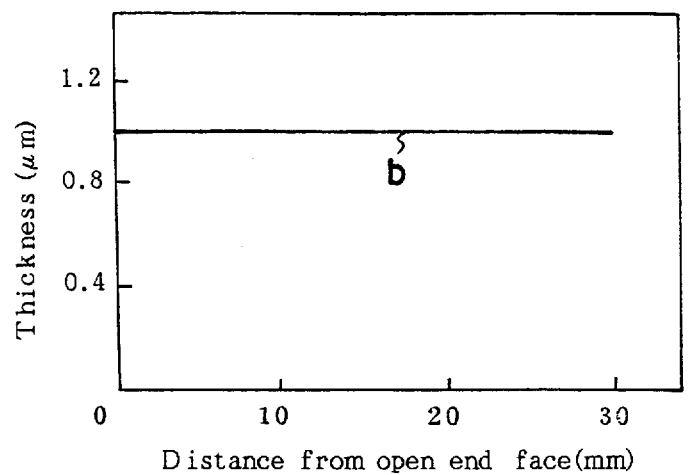
FIG. 4 is a graph showing a relation between a distance of a hard carbon film formed on the inner surface of a cylindrical member from the open end thereof and a thickness thereof formed by the method of the present invention.

Further, since the electrode characteristic inside the center bore 11a of the cylindrical member 11 is made uniform along the entire length thereof, there does not occur any thickness distribution in the hard carbon film formed on the inner surface 11b of the cylindrical member 11, thereby forming the hard carbon film having a uniform thickness of about 1.0 μm extending from the portion adjacent to the open end to the inner side, as shown by the line b in FIG. 4.

The auxiliary electrode 23 may have a diameter which is smaller than the diameter of the center bore 11a of the cylindrical member 11, and it may be preferable to have a gap of about 5 mm between itself and the inner surface 11b, namely, it may be preferable to provide a plasma forming region.

The auxiliary electrode 23 may be made of a conductive material, for example, a metallic material such as a stainless steel. The auxiliary electrode 23 has a circular shape in cross section, and it does not protrude from the upper end surface of the cylindrical member 11 at the tip end thereof when it is inserted into the cylindrical member 11, and it is positioned to be flush with the upper end surface of the cylindrical member 11 or slightly inside (1 to 2 mm) the cylindrical member 11.

A hard carbon film forming process according to another embodiment of the present invention will be described with reference to FIG. 2.

The vacuum vessel 13 used in this embodiment is not provided with the anode 31 and filament 33 which are used by the previous embodiment as shown in FIG. 1.

The cylindrical member 11 for forming the hard carbon film is disposed in the vacuum vessel 13 having the gas inlet port 15 and the gas outlet port 17 while the flange 11c of the cylindrical member 11 is placed on the insulating work supports 10 in the same manner as in the previous embodiment, then the grounded rod-shaped auxiliary electrode 23 is inserted into the center bore 11a of the cylindrical member 11.

The vacuum vessel 13 is evacuated to a vacuum of $3\times10^{-5}$ torr through the gas outlet port 17, and methane gas ($CH_4$ gas) is supplied into the vacuum vessel 13 as a gas containing carbon through the gas inlet port 15, and the pressure is adjusted to a vacuum of 0.1 torr.

Further, high frequency power of 400 W is applied to the cylindrical member 11 from a high-frequency power source 21 having an oscillation frequency of 13.56 MHz through a matching circuit 19, thereby producing a plasma in the vacuum vessel 13.

At this time, the plasma is produced not only around the cylindrical member 11 but also inside the center bore 11a so that a hard carbon film is formed uniformly over the inner surface 11b with high adhesion by a plasma CVD process. The hard carbon film is not differentiated in quality between the outer surface and the inner surface 11b defining the center bore 11a.

The operation and effect of the invention when the grounded auxiliary electrode 23 is inserted into the center bore 11a of the cylindrical member 11 are the same as those in the previous embodiment.

The hard carbon film forming process according to still another embodiment will be now described with reference to FIG. 3.

The vacuum vessel 13 used in this embodiment is not provided with the anode 31 and filament 33.

Figure 3:
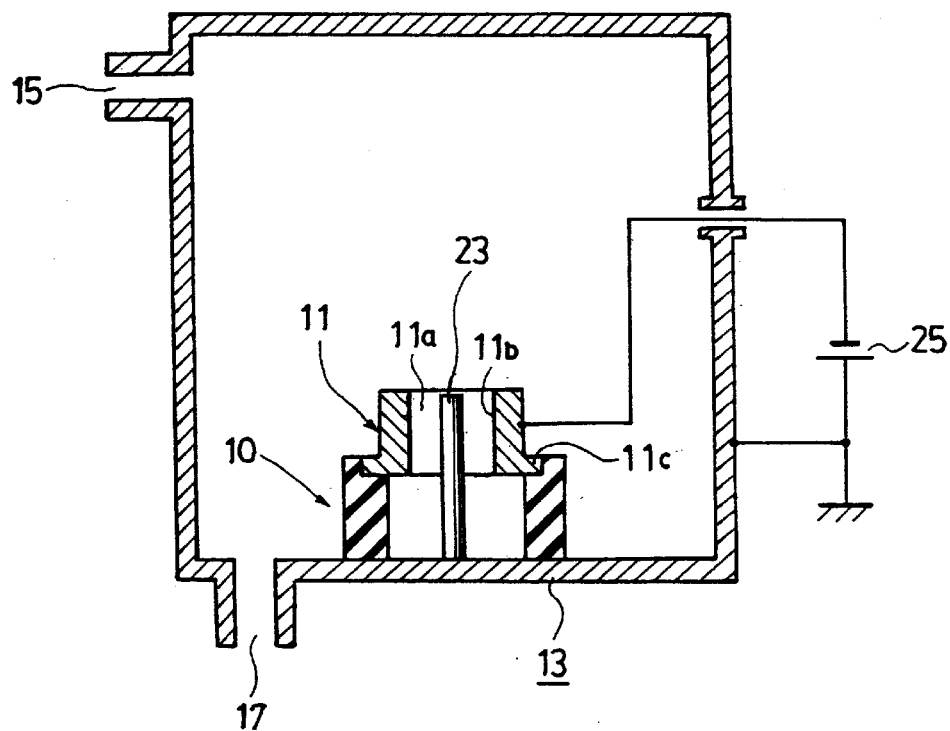

Also in this embodiment as shown in FIG. 3, the cylindrical member 11 for forming the hard carbon film is disposed in the vacuum vessel 13 provided with the gas inlet port 15 and gas outlet port 17, and the grounded auxiliary electrode 23 is inserted into the center bore 11a of the cylindrical member 11.

The vacuum vessel 13 is evacuated to a vacuum of $3\times10^{-5}$ torr through the gas outlet port 17, then methane gas ($CH_4$ gas) is supplied into the vacuum vessel 13 as a gas containing carbon through the gas inlet port 15, and the pressure is adjusted to a vacuum of 0.1 torr.

A DC voltage of –600 V is applied through the DC power source 25 to the cylindrical member 11, thereby producing a plasma. The plasma is produced not only in the outer surface of the cylindrical member 11 but also inside the center bore 11a, thereby forming the hard carbon film uniformly over the inner surface 11b with high adhesion by a plasma CVD process.

The operation and effect of the invention when the grounded auxiliary electrode 23 is inserted in the center bore 11a of the cylindrical member 11 are the same as those of the respective previous embodiments.

In each embodiment set forth above, the hard carbon film is formed over the entire surfaces of the cylindrical member 11, namely, over the outer surface and inner surface 11b of the cylindrical member 11, but it may be formed over the inner surface 11b alone.

In this case, the outer surface of the cylindrical member 11 is covered with a covering material and it is then disposed in the vacuum vessel 13. The hard carbon film may be simply formed over the inner surface of the cylindrical member 11 after wrapping aluminum foil around the outer surface of the cylindrical member 11.

Further, in each embodiment set forth above, the hard carbon film is formed directly over the surface of the cylindrical member 11, but it may be formed through an intermediate layer to enhance the adhesion.

In that case, as the intermediate layer, silicon, germanium belonging to group IVb of the Periodic Table, or compounds of silicon and germanium may be used. Alternatively, the intermediate layer may be formed of compounds including carbon such as silicon carbide (SiC) or titanium carbide (TiC).

Figure 6:
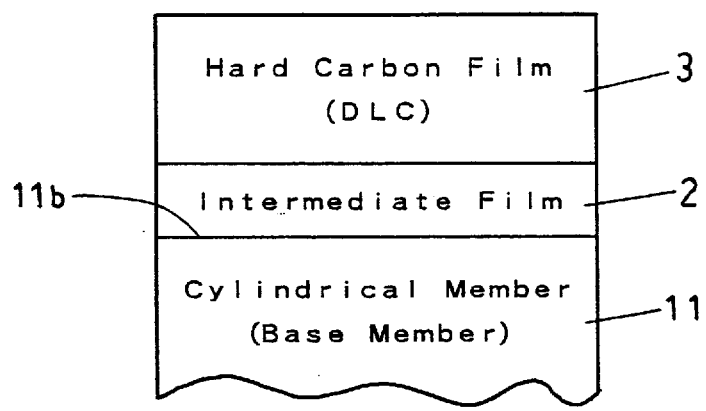
FIGS. 6 and 7 are partially enlarged sectional views showing various examples of a coating structure of a hard carbon film formed over the inner surface of the cylindrical member through an intermediate layer.
Figure 7:
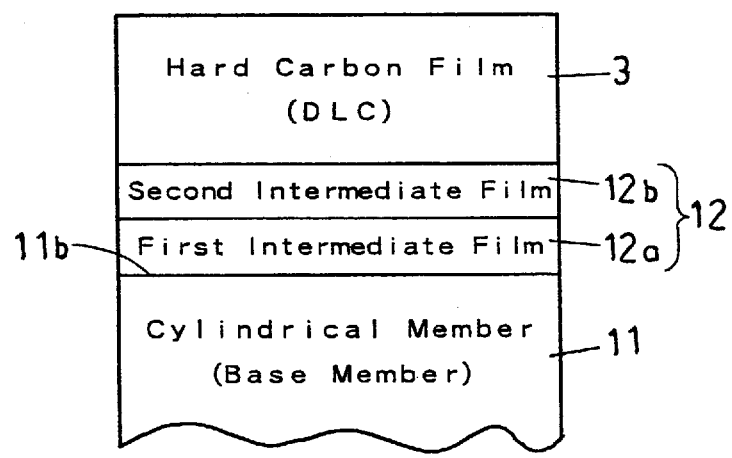

FIGS. 6 and 7 are partially enlarged sectional views showing a method of forming an intermediate layer on the inner surface 11b of the cylindrical member 11, and then a hard carbon film 3 is formed over the intermediate layer.

FIG. 6 shows a case where a one-layer intermediate layer 2 is formed, and FIG. 7 shows a case where a two-layer intermediate layer 12 comprising a first intermediate layer 12a (lower layer) and a second intermediate layer 12b (upper layer) is formed.

The one-layer intermediate layer 2 shown in FIG. 6 is made of silicon or germanium film, a titanium-silicon alloy film (metal silicide film), a titanium-carbon alloy film (metal carbide film) or the like.

The first intermediate layer 12a of the two-layer intermediate layer 12 shown in FIG. 7 is made of titanium (Ti), chromium (Cr), molybdenum (Mo), tungsten (W), tantalum (Ta) or aluminum (Al), etc., and the second intermediate layer 12b is made of a titanium-silicon alloy (a metal silicide) film, a metal carbide film, such as a titanium-carbon alloy (titanium carbide) film, or silicon (Si) or germanium (Ge), etc.

As a method of forming the one-layer intermediate layer 2 or two-layer intermediate layer 12, it is possible to adopt a sputtering process, an ion plating process or a CVD process or thermal spraying.

Figure 5:
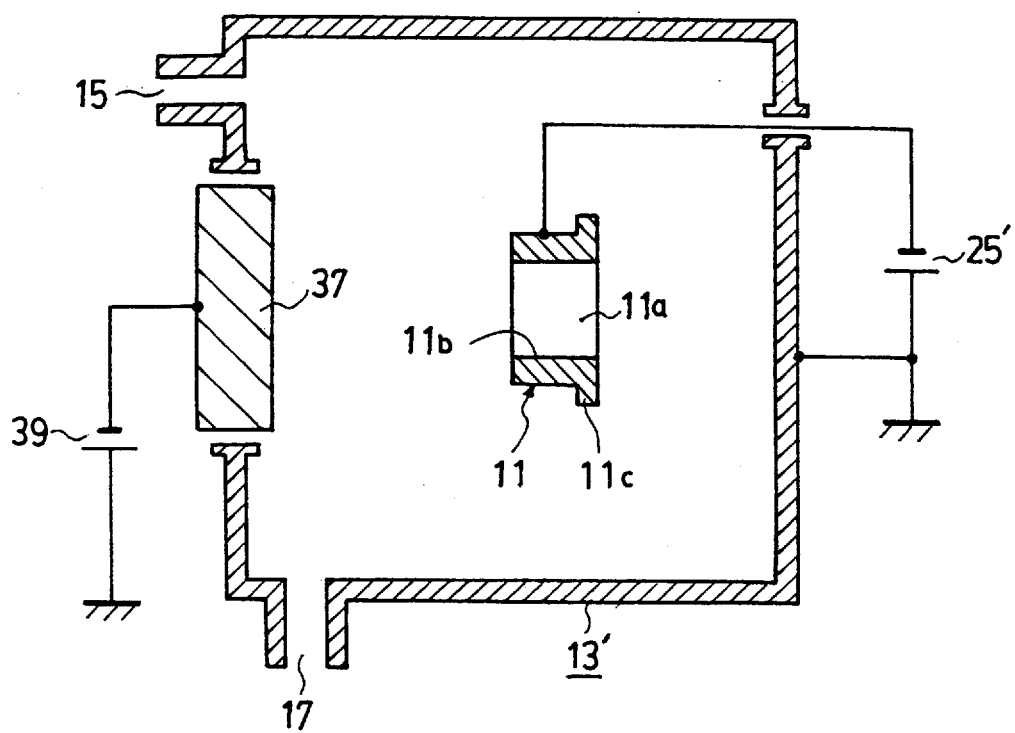
FIG. 5 is a schematic sectional view for explaining an example of a process for forming an intermediate layer over the inner surface of the cylindrical member.

An example of an intermediate layer forming process will be now described with reference to FIG. 5. An intermediate layer material 37 such as titanium-silicon alloy as a target is disposed in the side wall of a vacuum vessel 13' which is the same as used in the hard carbon film forming process, and the cylindrical member 11 is disposed in the vacuum vessel 13' to oppose the intermediate layer material 37 at one end surface thereof.

The vacuum vessel 13' is evacuated by a means, not shown, to a vacuum of $3\times10^{-5}$ torr. Thereafter, Ar gas as a sputtering gas is supplied into the vacuum vessel 13' through the gas inlet port 15, thereby adjusting the vacuum vessel 13' to a vacuum of $5\times10^{-3}$ torr.

Still further, a DC power source 39 applies a DC voltage of −600 V to the intermediate layer material 37 while a DC power source 25' applies a DC voltage of −50 V to the cylindrical member 11. As a result, a plasma is produced in the vacuum vessel 13' and the surface of the intermediate layer material 37 as a target is sputtered by the Ar ions in the plasma.

The molecules of the intermediate layer material which are driven out by a sputtering stick to the entire surface of the cylindrical member 11 including the inner surface 11b, thereby forming the intermediate layer. The sputtering process continues for about 30 minutes so as to form an intermediate layer such as a titanium-silicon alloy film having a thickness of 0.5 μm over the inner surface 11b of the cylindrical member 11.

The intermediate layer material 37 as a target may use a material depending on an intermediate layer to be formed, wherein when the two-layer intermediate layer is formed, two kinds of intermediate layer materials for a lower film and an upper film are replaced with each other, thereby performing the intermediate layer forming process two times.

In such a manner, after the cylindrical member 11 having the inner surface 11b over which the intermediate layer is formed is disposed in the vacuum vessel 13 for forming the hard carbon film, the hard carbon film forming process may be executed by a plasma CVD process.

If the intermediate layer is formed over the surface of the cylindrical member 11, it is possible to form the hard carbon film by the various plasma CVD processes as set forth above since the voltage can be applied to the intermediate layer provided that the intermediate layer is conductive even if the cylindrical member 11 is formed of an insulating material such as ceramics.

Although there have been described embodiments of the hard carbon film forming processes using methane gas or benzene gas as a gas containing carbon to be supplied into the vacuum vessel, a gas containing carbon other than methane gas and benzene gas, such as ethane gas, or a vapor of a liquid containing carbon, such as hexane, may be used.

Figure 8:
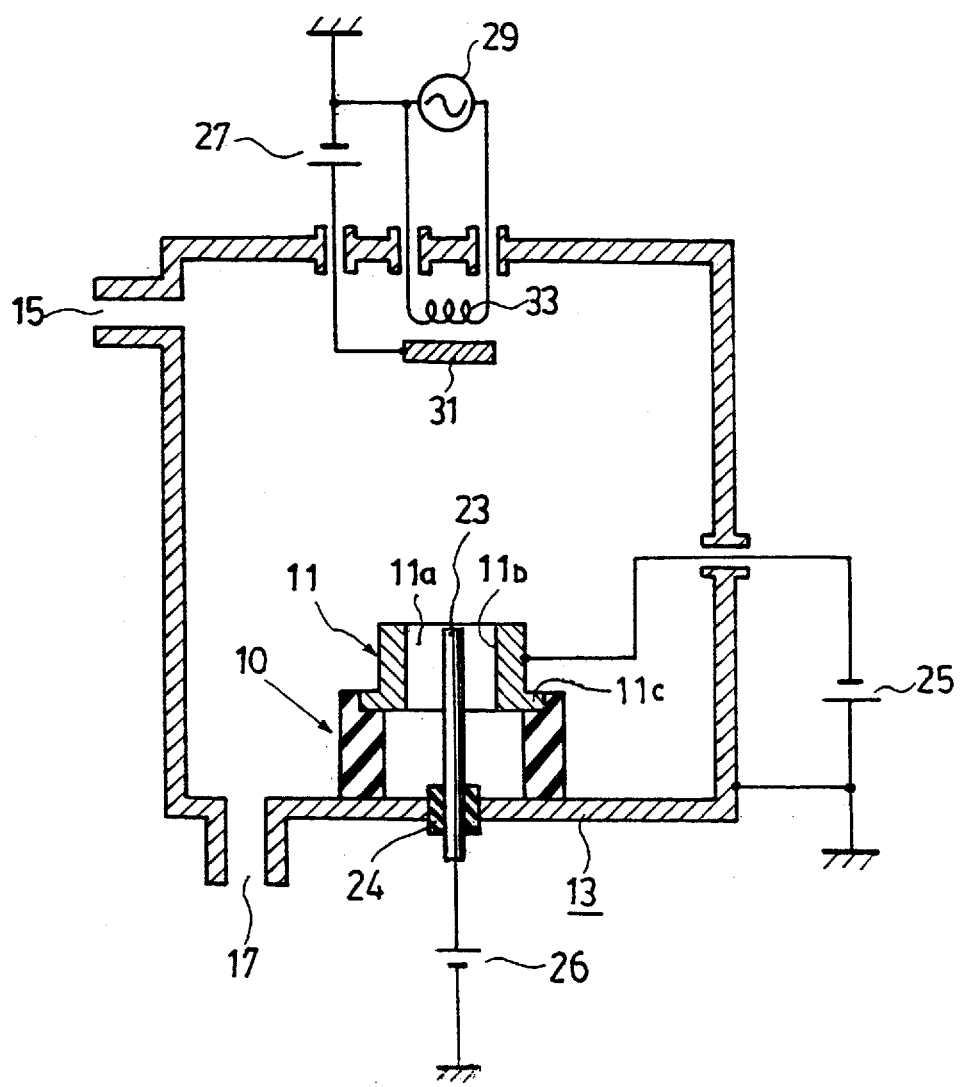
FIGS. 8, 9 and 10 are schematic sectional views for explaining film forming apparatuses for carrying out a hard carbon film forming process by applying a positive DC voltage to an auxiliary electrode according to respectively different embodiments of the present invention.
Figure 9:
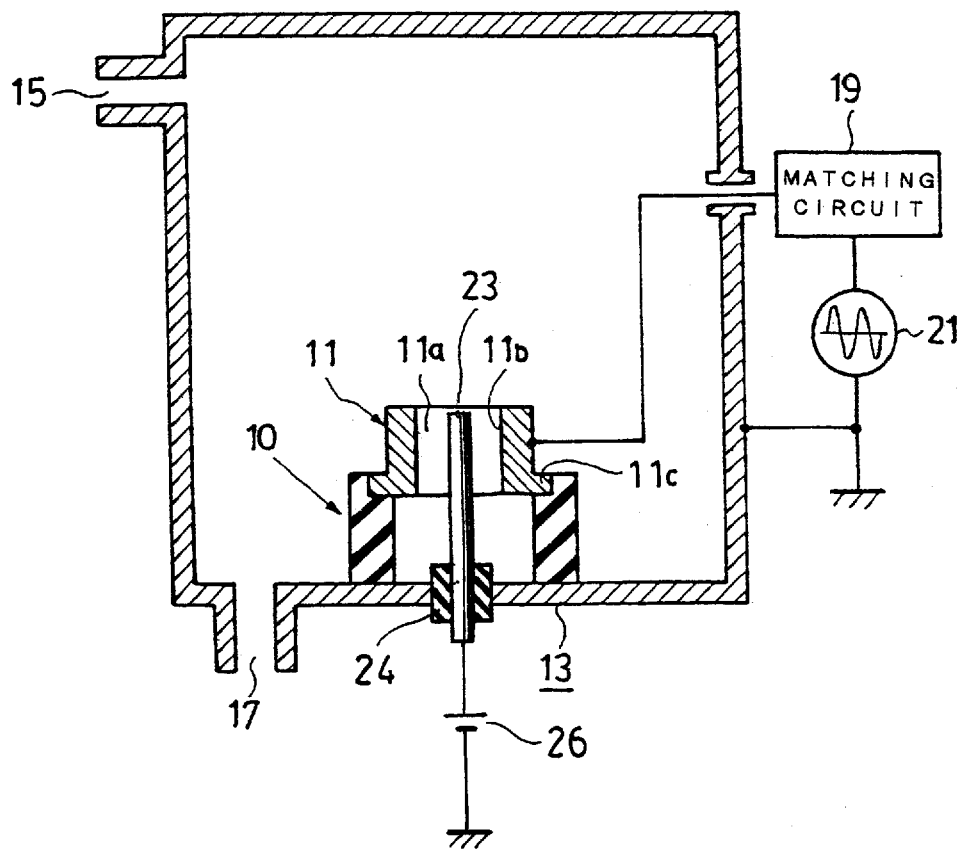
Figure 10:
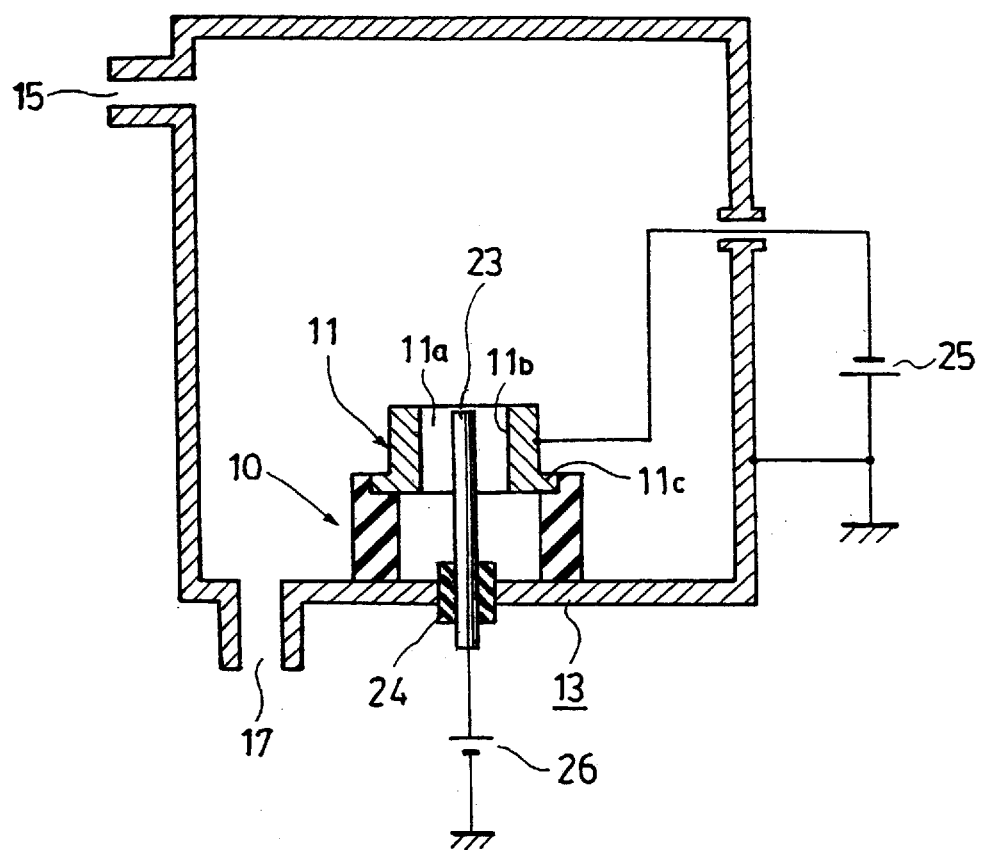

Described next with reference to FIGS. 8, 9 and 10 are embodiments showing a hard carbon film forming process of this invention, which is performed by applying a positive DC voltage to the auxiliary electrode.

Figure 2:
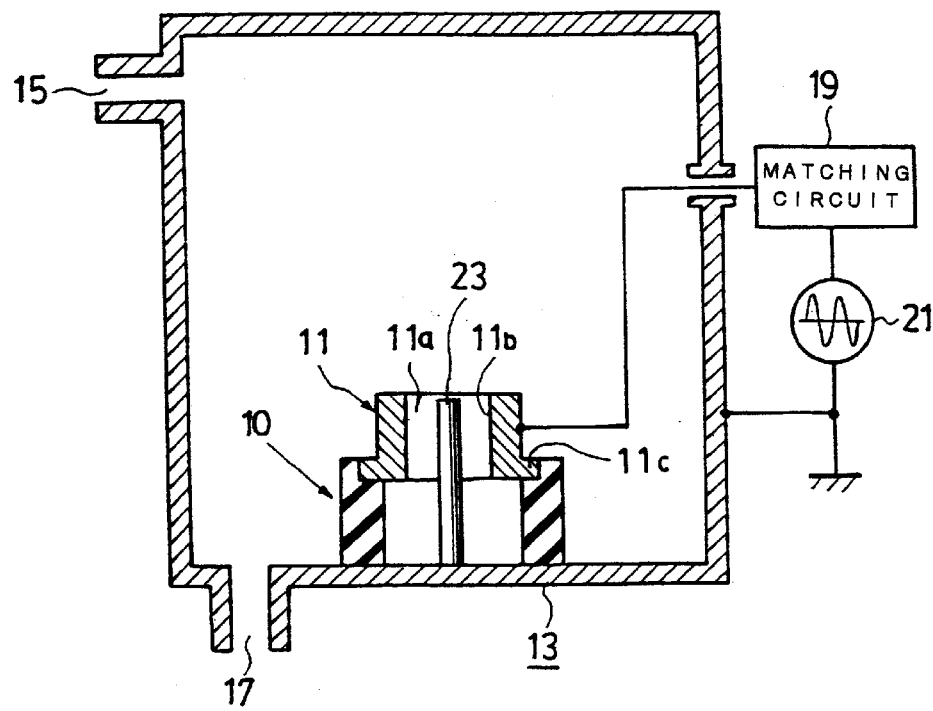

FIGS. 8 to 10 correspond to FIGS. 1 to 3 as explained in each of the previous embodiments, and components corresponding to those of FIGS. 1 to 3 are denoted by the same numerals, and explanation thereof is omitted.

The embodiments shown in FIGS. 8 to 10 differ from each of the previous embodiments only in that the auxiliary electrode 23 is insulated from the vacuum vessel 13 through an insulating member 24 such as a cylindrical porcelain insulator, and a DC voltage source 26 applies a positive DC voltage of about 10 V to 30 V to the auxiliary electrode 23.

The production of plasma inside the center bore 11a of the cylindrical member 11 is accelerated as the voltage applied to the auxiliary electrode 23 is increased from 0 V, whereby the film thickness of the hard carbon film formed over the inner surface 11b per unit of time will be increased. That is, the film forming speed is expedited.

Further, although it is difficult to produce a plasma as the dimensions of gap defined between the inner surface 11b of the cylindrical member 11 and the auxiliary electrode 23 become small, thereby making it difficult to form the hard carbon film, this can be improved if the positive DC voltage is applied to the auxiliary electrode 23 so that the hard carbon film can be formed on the inner surface of the cylindrical member having a small bore diameter.

The operation is the same for each embodiment shown in FIGS. 8 to 10 for forming the hard carbon film over the inner surface 11b of the cylindrical member 11.

Different embodiments of the hard carbon film forming process according to the present invention using a dummy member will be now described with reference to FIGS. 11, 12, and 13.

Figure 11:
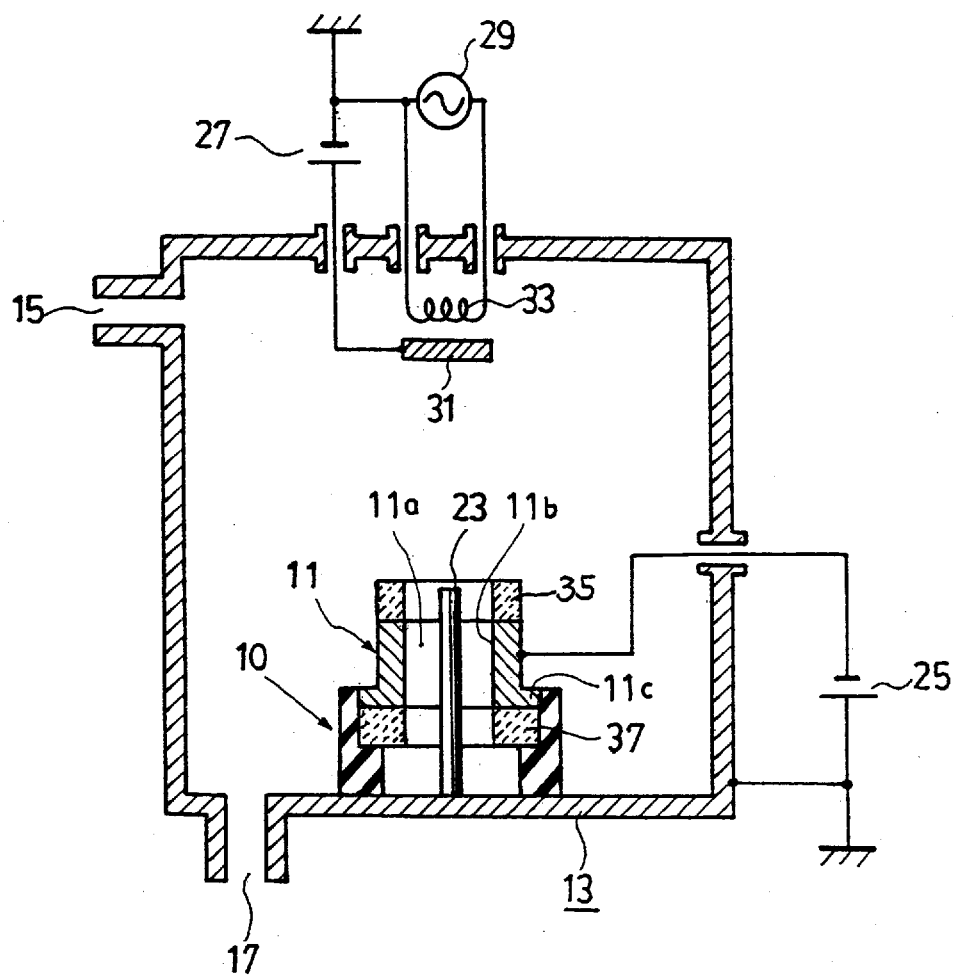
FIGS. 11, 12 and 13 are schematic sectional views for explaining film forming apparatuses for carrying out a hard carbon film forming process using a dummy member according to respectively different embodiments of the present invention.
Figure 12:
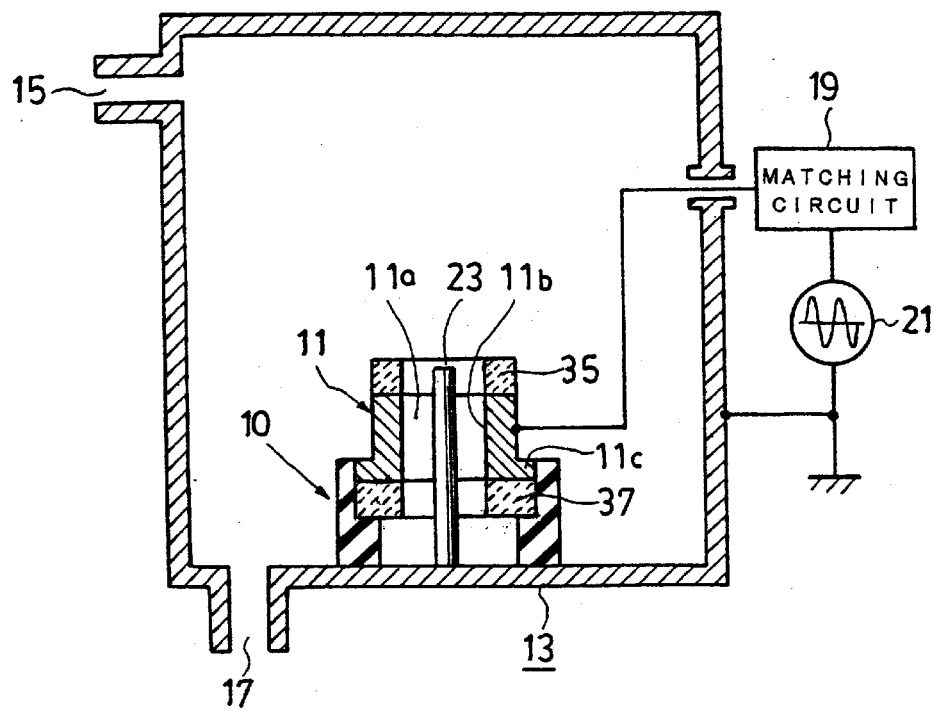
Figure 13:
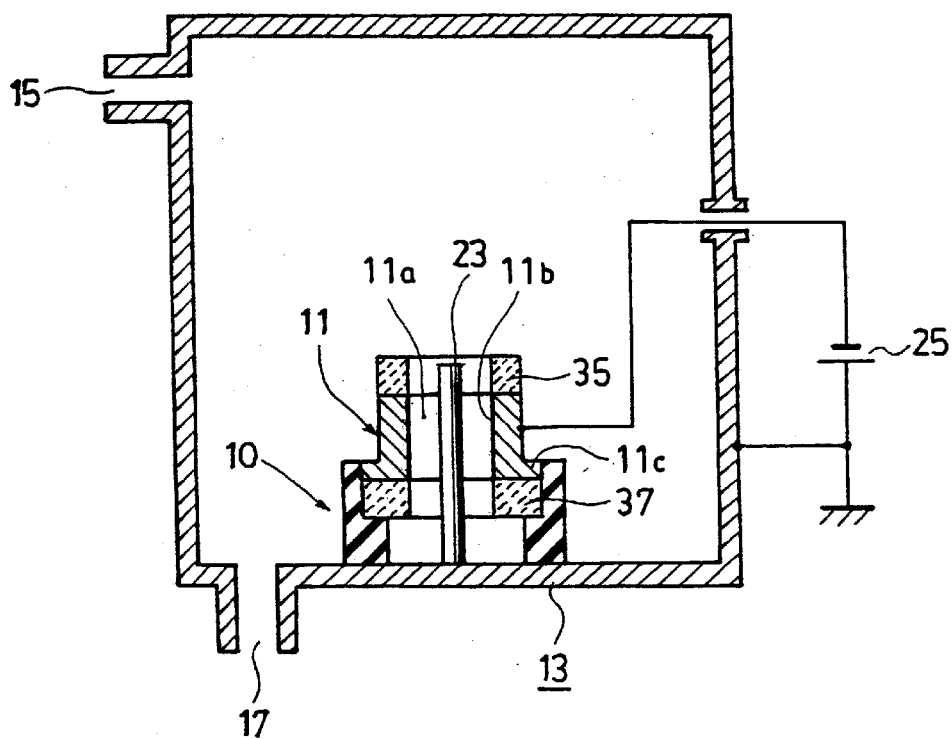
Figure 14:
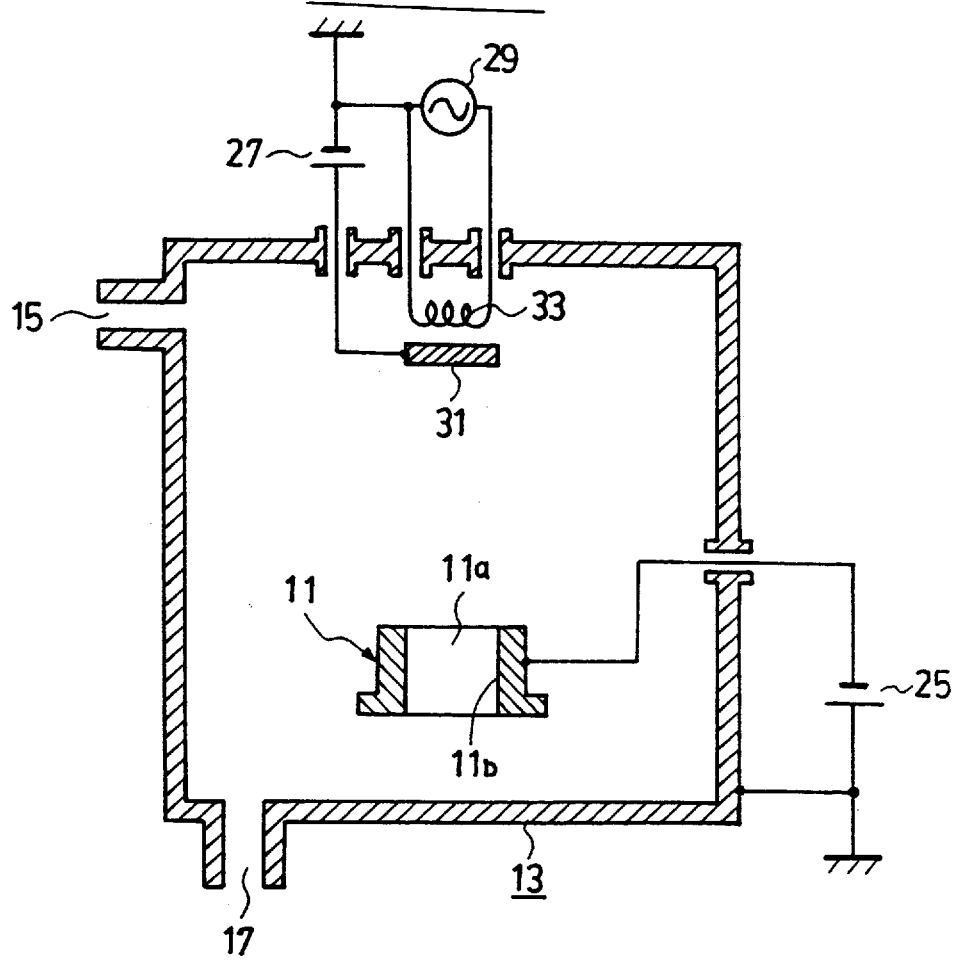
FIG. 14 is a schematic sectional view of an apparatus for explaining an example of a process for forming a hard carbon film over the inner surface of a cylindrical member by a conventional plasma CVD process.
Figure 15:
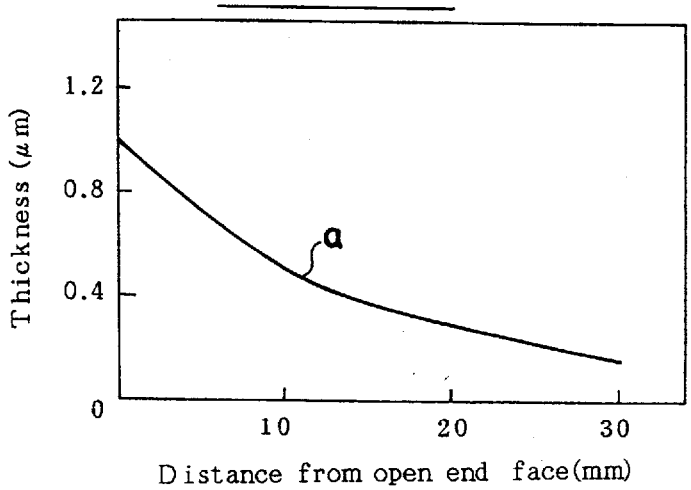
FIG. 15 is a graph showing a thickness distribution in the hard carbon film formed over the inner surface of a cylindrical member by the prior art method in FIG. 14.

FIGS. 11 to 13 correspond to FIGS. 1 to 3 as explained in each of the previous embodiments, and the components corresponding to those of FIGS. 1 to 3 are denoted by the same numerals and the explanation thereof is omitted.

The embodiments set forth in FIGS. 11 to 13 are different from those shown in FIGS. 1 to 3 in that dummy members 35 and 37 are disposed in a manner that the lower end surface of the dummy member 35 is brought into contact with the upper end surface of the cylindrical member 11, and the upper end surface of the dummy member 37 is brought into contact with the lower end surface of the cylindrical member 11, and the auxiliary electrode 23' is inserted into the center bore 11a of the cylindrical member 11 and the center bores of the dummy members 35 and 37 to extend to the entire length thereof. At this time, the length of the auxiliary electrode 23 is set so that the tip end thereof does not protrude from the upper end surface of the dummy member 35. Preferably it is positioned inside the upper end surface 1 of the dummy member 35 by about 1 to 2 mm inside.

The dummy members 35 and 37 respectively have center bores the diameter of which are the same as the center bore 11a of the cylindrical member 11, and they are formed of ring-like (including cylindrical shaped) members each having an outer diameter which is substantially the same as each outer diameter of each end surface, and they are also made of a conductive material such as stainless steel like the auxiliary electrode 23.

The cylindrical member 11 and the dummy members 35 and 37 are laid one on top of the other in a manner such that the central axis of the center bore 11a of the cylindrical member 11 conforms to the central axes of the center bores of the dummy members 35 and 37, and they are disposed in the vacuum vessel 13. Accordingly, the inner surface 11b of the cylindrical member 11 is flush with the inner surfaces of the dummy members 35 and 37 without forming any step therebetween.

The dummy members 35 and 37 play the following roles.

That is, a plasma is produced inside and outside of the surface of the center bore 11a of the cylindrical member 11 in a method of forming a hard carbon film in any of FIGS. 11 to 13. Electric charge is liable to concentrate at the end surface of the cylindrical member 11, and hence the electric charge at the area adjacent to the open end of the center bore 11a is higher than that at the inner side of the center bore 11a, namely, a so-called an edge effect is generated. Accordingly, the intensity of plasma adjacent to the open end of the cylindrical member 11 is greater than that of the other area and is unstable.

Further, the open end of the cylindrical member 11 is influenced by both plasmas produced at the inner surface and the outer surface thereof.

Accordingly, if the hard carbon film is formed over the surface of the cylindrical member 11 without disposing the dummy members 35 and 37 at both open end surfaces of the cylindrical member 11, the adhesion of the hard carbon film at an area extending several mm from the open end of the cylindrical member 11 to the inner side thereof is slightly inferior than that of the other regions, and further the quality of film of the former is slightly different from that of the latter.

Accordingly, if the hard carbon film is formed over the surface of the cylindrical member 11 after the dummy members 35 and 37 are disposed at both open end surfaces of the cylindrical member 11, an area where the quality and adhesion of the film is slightly differentiated from the others is not formed on the inner surface 11b of the cylindrical member 11 but is formed on the open end inner surfaces of the dummy members 35 and 37.

When the hard carbon film was formed using an apparatus shown in FIG. 11 but without using the dummy members 35 and 37, an experiment showed that the area where the quality and adhesion of the film was differentiated was formed at the portion extending about 4 mm from the open end surface to the inner side of the inner surface 11b of the cylindrical member 11, with the width ranging from 1 mm to 2 mm.

Thereupon, the film was formed under the same forming condition of the hard carbon film shown in FIG. 1 after the dummy members 35 and 37 having substantially the same open dimensions as those of the cylindrical member 11 and a length of 10 mm were respectively disposed at both open end surfaces of the cylindrical member 11.

As a result, the area where the quality and adhesion of the film was differentiated was formed over the inner surfaces of the dummy members 35 and 37 and it was not at all formed over the inner surface 11b of the cylindrical member 11.

The function of the dummy members 35 and 37 is the same as the case where the hard carbon film is formed over the inner surface 11b of the cylindrical member 11 by the method in any of FIGS. 11 to 13.

If the diameter of the center bore 11a of the cylindrical member 11 is differentiated at both open ends thereof, the inner diameter of each open end is permitted to be substantially the same as the inner diameter of the open end of the dummy member which contacts the cylindrical member 11.

If the uniformity of the hard carbon film adjacent to only one open end but not both open ends of the cylindrical member 11 is important, the dummy member may be disposed on the particular open end surface alone.

According to the method of forming the hard carbon film over the inner surface of the cylindrical member of the invention, which is evident from the above explanation, the auxiliary electrode is inserted into the center bore of the cylindrical member, and the auxiliary electrode is grounded or a positive DC voltage is applied to the auxiliary electrode to form the hard carbon film by a plasma CVD process.

Accordingly, since electrodes having the same potential do not oppose each other in the center bore of the cylindrical member, the hollow discharge as an abnormal discharge does not occur so that the plasma is generated sufficiently in the center bore along the entire length thereof, thereby forming the hard carbon film with uniform thickness and excellent adhesion at the entire area of the inner surface.

Further, since the hard carbon film is formed after the dummy member having the open end the diameter of which is the same as that of the open end of the cylindrical member is disposed in the open end of the cylindrical member, the area where quality and adhesion of the hard carbon film is differentiated is not formed at the area adjacent to the open end of the inner surface of the cylindrical member, thereby forming the hard carbon film uniformly over the entire area of the inner surface.

What is claimed is:

1. A method of forming a hard carbon film over an inner surface of a cylindrical member having a center bore with hydrogenated amorphous carbon, the method comprising:

disposing the cylindrical member in a vacuum vessel provided with a gas inlet port and a gas outlet port;

inserting an auxiliary electrode into the center bore of the cylindrical member along a central axis thereof to extend to substantially an entire length thereof, and grounding the auxiliary electrode or applying a positive DC voltage to the auxiliary electrode;

evacuating the vacuum vessel, then supplying a gas containing carbon through the gas inlet port into the vacuum vessel;

applying a voltage to the cylindrical member to produce a plasma in the vacuum vessel including an inside of the center bore of the cylindrical member, thereby forming the hard carbon film over the inner surface of the cylindrical member by a plasma chemical vapor deposition process.

2. The method of forming a hard carbon film over an inner surface of a cylindrical member according to claim 1, wherein the vacuum vessel is provided with an anode and a filament therein, and a DC voltage is applied to the cylindrical member while the DC voltage is also applied to the anode and an AC voltage is applied to the filament, thereby producing the plasma in the vacuum vessel including the inside of the center bore of the cylindrical member.

3. The method of forming a hard carbon film over an inner surface of a cylindrical member according to claim 1, wherein radio frequency power is applied to the cylindrical member, thereby producing the plasma in the vacuum vessel including the inside of the center bore of the cylindrical member.

4. The method of forming a hard carbon film over an inner surface of a cylindrical member according to claim 1, wherein a DC voltage is applied to the cylindrical member, thereby producing the plasma in the vacuum vessel including the inside of the center bore of the cylindrical member.

5. The method of forming a hard carbon film over an inner surface of a cylindrical member according to claim 1, further comprising a step of forming an intermediate layer over the inner surface of the cylindrical member for enhancing adhesion to the hard carbon film before the cylindrical member is disposed in the vacuum vessel.

6. A method of forming a hard carbon film over an inner surface of a cylindrical member having a center bore with hydrogenated amorphous carbon, the method comprising:

disposing a dummy member having a center bore a diameter of which is substantially the same as that of the center bore of the cylindrical member with the cylindrical member in a manner that one end surface of the dummy member contacts at least one open end surface of the cylindrical member while a central axis of the center bore of the dummy member matches that of the cylindrical member;

disposing the cylindrical member and the dummy member in a vacuum vessel provided with a gas inlet port and a gas outlet port;

inserting an auxiliary electrode into the center bores of the cylindrical member and dummy member along central axes thereof to extend to substantially an entire length thereof, and permitting the auxiliary electrode to be grounded or applying a positive DC voltage to the auxiliary electrode;

evacuating the vacuum vessel, then supplying a gas containing carbon into the vacuum vessel through the gas inlet port;

applying a voltage to the cylindrical member to produce a plasma in the vacuum vessel including an inside of the center bores of the cylindrical member and the dummy member, thereby forming the hard carbon film over the inner surface of the cylindrical member by a plasma chemical vapor deposition process.

7. The method of forming a hard carbon film over an inner surface of a cylindrical member according to claim 6, wherein the vacuum vessel is provided with an anode and a filament therein, and a DC voltage is applied to the cylindrical member while the DC voltage is applied to the anode and an AC voltage is applied to the filament, thereby producing the plasma in the vacuum vessel including the inside of the center bores of the cylindrical member and the dummy member.

8. The method of forming a hard carbon film over an inner surface of a cylindrical member according to claim 6, wherein radio frequency power is applied to the cylindrical member, thereby producing the plasma in the vacuum vessel including the inside of the center bores of the cylindrical member and the dummy member.

9. The method of forming a hard carbon film over an inner surface of a cylindrical member according to claim 6, wherein a DC voltage is applied to the cylindrical member, thereby producing the plasma in the vacuum vessel including the inside of the center bores of the cylindrical member and the dummy member.

10. The method of forming a hard carbon film over an inner surface of a cylindrical member according to claim 1 further comprising a step of forming an intermediate layer over the inner surface of the cylindrical member for enhancing adhesion to the carbon film before the cylindrical member is disposed in the vacuum vessel.

* * * * *